United States Patent [19]
Christin et al.

[11] Patent Number: 5,904,957
[45] Date of Patent: May 18, 1999

[54] VAPOUR PHASE CHEMICAL INFILTRATION PROCESS FOR DENSIFYING POROUS SUBSTRATES DISPOSED IN ANNULAR STACKS

[75] Inventors: François Christin, Saint Aubin Du Medoc; Pierre Daubigny, Saint Medard En Jalles; Pierre Delaurens, Pessac; Jean-Luc Leluan, Bordeaux, all of France

[73] Assignee: Societe Europeenne de Propulsion, Suresnes, France

[21] Appl. No.: 08/945,325

[22] PCT Filed: Apr. 17, 1996

[86] PCT No.: PCT/FR96/00582

§ 371 Date: Oct. 15, 1997

§ 102(e) Date: Oct. 15, 1997

[87] PCT Pub. No.: WO96/33295

PCT Pub. Date: Oct. 24, 1996

[30] Foreign Application Priority Data

Apr. 18, 1995 [FR] France .................................. 95 04586

[51] Int. Cl.[6] .................................................. C23C 16/26
[52] U.S. Cl. ........................................ 427/248.1; 427/249
[58] Field of Search ................................. 427/248.1, 249

[56] References Cited

U.S. PATENT DOCUMENTS 5,221,354  6/1993  Rigney ..................................... 118/725
5,348,774  9/1994  Golecki et al. .......................... 427/249
5,480,678  1/1996  Rudolph et al. ...................... 427/248.1

FOREIGN PATENT DOCUMENTS 0393520    10/1990  European Pat. Off. .
54-023039   2/1979  Japan .
WO8704733   8/1987  WIPO .
WO9615285   5/1996  WIPO ............................. C23C 16/04

Primary Examiner—Shrive Beck
Assistant Examiner—Timothy Meeks
Attorney, Agent, or Firm—Weingarten, Schurgin, Gagnebin & Hayes LLP

[57] ABSTRACT

A chemical vapor infiltration method for densifying porous substrates disposed in annular stacks. The substrates to be densified (12) are loaded inside a reaction chamber (11) of an infiltration oven, being disposed in at least one annular stack (30) defining an interior passage (31) with spaces (33) being formed between the substrates. The gas admitted into the reaction chamber is channelled on leaving a preheating zone (18) towards one of the two volumes constituted by the inside and the outside of the, or each, stack of substrates, and preferably towards the smaller volume. This volume (31) is closed at its opposite end so that the gas flows from admission into the chamber to its exhaust from the chamber from the inside to the outside of the, or each, stack, or vice versa, with the gas passing through the spaces between the substrates and diffusing into them.

13 Claims, 4 Drawing Sheets

5,904,957

VAPOUR PHASE CHEMICAL INFILTRATION PROCESS FOR DENSIFYING POROUS SUBSTRATES DISPOSED IN ANNULAR STACKS

The present invention relates to a chemical vapor infiltration method for densifying porous substrates disposed in annular stacks, i.e. substrates that are substantially bodies of revolution with a central opening or passage and which are disposed in at least one stack defining an interior passage formed by the central openings of the substrates, or substrates that are not necessarily annular in shape, but which are disposed to form a stack with an interior passage defined by the stacked substrates.

BACKGROUND OF THE INVENTION

The field of application of the invention lies in particular in manufacturing composite material parts comprising a porous substrate or "preform" densified by a matrix.

To manufacture composite material parts, in particular thermostructural composite material parts constituted by a refractory fiber preform (e.g. carbon or ceramic fibers) densified by a refractory matrix (e.g. carbon or ceramic), it is common practice to use chemical vapor infiltration methods. Examples of such parts are carbon—carbon (C—C) composite nozzles for thrusters, or C—C composite brake disks, in particular for airplane brakes.

Densifying porous substrates by chemical vapor infiltration consists in placing the substrates in a reaction chamber of an infiltration installation by means of support tooling, and in admitting into the chamber a gas having one or more components constituted by precursors for the material that is to be deposited within the substrates for the purpose of densifying them. Infiltration conditions, in particular gas composition and flow rate, and also temperature and pressure inside the chamber are selected to enable the gas to diffuse within the accessible internal pores of the substrates so that the desired material is deposited therein by a component of the gas decomposing or by a reaction between a plurality of the components thereof.

The conditions required for chemical vapor infiltration of pyrolytic carbon or "pyrocarbon" have been known for a long time to the person skilled in the art. The precursor for carbon is an alkane, an alkyl, or an alkene, generally propane, methane, or a mixture thereof. Infiltration is performed at a temperature of about 1000° C. at a pressure of about 1 kPa, for example. The infiltration conditions required for chemical vapor infiltration of materials other than carbon, in particular ceramic materials, are also well known. On this topic, reference may be made in particular to document FR-A-2 401 888.

In an industrial installation for chemical vapor infiltration, it is usual to load the reaction chamber with a plurality of substrates or preforms to be densified simultaneously, by using support tooling comprising, in particular, trays and spacers. When the preforms are annular, they may be stacked in a longitudinal direction of the reaction chamber. The gas containing the precursor(s) of the material to be deposited within the preforms is admitted at one longitudinal end of the chamber, while the residual gas is evacuated from the opposite end where it is extracted by pumping means. Means are generally provided to preheat the gas before it reaches the preforms to be densified, e.g. means in the form of perforated preheating plates through which the gas passes on being admitted into the reaction chamber.

A real difficulty encountered with known chemical vapor infiltration methods is to ensure that the microstructure of the material deposited within the substrates is constant. In the particular case of composite material parts, the expected properties of said parts require the microstructure of the matrix to be constant and of the kind desired. Thus, in the example of infiltrating pyrolytic carbon or "pyrocarbon", variations in infiltration conditions, even very small variations, can lead to changes in the microstructure of the pyrocarbon. Unfortunately pyrocarbons of the smooth laminar type, of the rough laminar type, and of the isotropic type have properties that are quite distinct. For example, if it is desired to obtain a graphitable pyrocarbon matrix by heat treatment, it is preferable to obtain a rough laminar type microstructure. In practice, in spite of the care given to controlling infiltration conditions, changes are observed in the microstructure of the pyrocarbon deposited within preforms, in particular within the preforms that are furthest from the access for the gas into the chamber. Such irregular microstructure has sometimes gone as far as forming soot and as forming undesirable dendritic growths in the reaction chamber.

To solve that problem, attempts have been made to significantly increase the flow rate of the gas admitted into the chamber, such that similar gas is presented to all of the preforms in the load. However it is then necessary to provide a more powerful pumping device, which is therefore more expensive, and more gas is consumed. In addition, the effectiveness of the preheating is decreased if the gas passes more quickly through the preheater plates. To bring the gas to the desired temperature not later than its first contact with a preform to be densified, it is necessary to increase the number of preheating plates, but that is detrimental to the working volume available inside the chamber, and thus to the overall throughput of the installation.

SUMMARY OF THE INVENTION

An object of the present invention is to provide a method enabling the above-mentioned drawbacks to be avoided, i.e. a chemical vapor infiltration method that makes it possible to guarantee constancy of the microstructure deposited within the densified substrates, and to do so without requiring an increase in the flow rate of the gas or a restriction on the loadable volume both of which are harmful in terms of the cost and the throughput of the installation.

This object is achieved by a chemical vapor infiltration method for densifying porous substrates by depositing material within the substrates, the method comprising: loading substrates to be densified into a reaction chamber of an infiltration oven, the substrates being disposed in at least one annular or hollow stack which extends in a longitudinal direction of the chamber and which defines an interior passage with spaces being formed between the substrates; admitting a gas containing at least a precursor of the material to be deposited into the reaction chamber in the vicinity of a first longitudinal end thereof; and exhausting the residual gas via an outlet situated in the vicinity of the longitudinal end of the reaction chamber opposite from the first longitudinal end;

in which method the gas admitted into the reaction chamber is channeled towards one of the two volumes constituted by the inside and the outside of the stack(s) of substrates at the end thereof closer to the first longitudinal end of the chamber; and the volume into which the gas is channeled is closed at its end further from the first longitudinal end of the chamber; such that between admission into the chamber and exhaust from the chamber, the gas flows from the inside towards the outside of the, or each, stack, or vice versa, with the gas passing through the spaces between the substrates and diffusing into them.

Advantageously, when the gas admitted into the chamber is preheated by passing through a preheating zone situated at the first end of the chamber, the channeling of the gas towards the inside or the outside of the, or each, stack is performed at the outlet from the preheating zone.

This method provides a clear improvement in infiltration conditions for the purpose of achieving the desired object, in particular when compared with known methods in which the gas is admitted uniformly into the reaction chamber, i.e. when the chamber contains one or more stacks of substrates, with the gas being admitted simultaneously to the inside and to the outside of the, or each, stack.

A very important advantage of the method of the invention is that the retention time of the gas in the reaction chamber can be considerably decreased, without changing the admission flow rate. The gas is admitted only into the volume constituted either by the empty space formed by the central passage(s) of the stack(s) of substrates, or by the empty space around the stack(s) of substrates. This volume is very considerably smaller that the total volume of the reaction chamber that is not occupied by the load (the substrates and the support tooling), i.e. the combined volume of said empty spaces, such that a given quantity of gas flows much faster. In an industrial installation for infiltrating pyrocarbon in vapor form, the method of the invention has made it easy to limit the retention time to a value that is no greater than 1 second. Reducing retention time avoids excessive maturing and spoiling of the gas which could have the effect of changing the microstructure of the deposited material.

In addition, since the option is provided of greatly reducing retention time for a given flow rate, it is possible, insofar as the results obtained remain acceptable, to make do with a smaller reduction in retention time, or indeed to leave it unchanged, in which case the gas flow rate is reduced. Reducing the flow rate provides a saving in gas consumption. It also serves to reduce the bulk of the preheater means, and thus to increase the working volume of the oven, and it makes it possible to use smaller pumping means.

In order to optimize the reduction in retention time and/or the flow rate of the gas, it is preferable for the admitted gas to be channelled towards the smaller of the two volumes constituted by the inside and the outside of the stack(s) of substrates.

An additional advantage of the method lies in the fact that by requiring the gas to flow from the inside towards the outside of the, or each, pile of substrates, or vice versa, it is ensured that the surfaces of the substrates from which diffusion takes place towards the insides of the substrates are immersed in gas which is continuously renewed. When the gas is admitted into one end of both of the volumes as constituted by the inside and by the outside of the stack(s) of substrates, and when said volumes are not closed at the other end, then flow takes place preferentially in the longitudinal direction. Continuous renewal of the gas can then no longer be guaranteed in the spaces between the substrates, unless those spaces are made to be large enough. Unfortunately, stagnation of the gas in the spaces between the substrates means that the retention time becomes large, thereby degrading the microstructure of the deposited material. If the substrates are spaced apart from one another by a distance which is large enough to enhance the flow of gas between them, then that is to the detriment of the occupancy rate of substrates in the infiltration oven.

With the method of the invention, flow necessarily takes place in continuous manner in the spaces between substrates, from the inside towards the outside of the, or each, stack, or vice versa. It is then possible for the spaces formed between the substrates in a stack to be narrow, and merely sufficient to ensure pressure balancing between the inside and the outside of the stack. This makes it possible to optimize the occupancy rate of the oven by the substrates.

It can be desirable to maintain a constant flow rate of the gas in the longitudinal direction within the inside or outside volume towards which it is channelled, in spite of the headlosses caused by lateral leaks into the spaces between the substrates and in spite of diffusion into the substrates. To this end, it is possible to place in said volume at least one compensation element which extends in the longitudinal direction with a cross-section that increases in the flow direction of the gas.

The method of the invention is advantageously used to densify annular preforms for brake disks. The preforms may be placed in a stack or in a plurality of parallel stacks in the longitudinal direction of the reaction chamber. The gas admitted is then preferably channelled towards the insides of the stacks of preforms.

The method of the invention can also be used for densifying other preforms that are annular or substantially annular, in particular preforms for the diverging parts of thruster nozzles. The preforms are then placed one above another, preferably ensuring that each preform is partially engaged in another. Since the internal passage through each preform has a relatively large diameter, the admitted gas is then channeled towards the outside of the, or each, stack of preforms, since that normally provides a smaller volume than does the inside.

The method of the invention can also be used to densify substrates that are not necessarily annular, i.e. that are not necessarily bodies of revolution with a central opening or passage. Under such circumstances, the stack of substrates is made in such a manner as to form at least one annular or hollow stack with an interior passage surrounded by the stacked substrates.

BRIEF DESCRIPTION OF THE DRAWINGS

Implementations of the method of the invention are described below by way of non-limiting indication.

Reference is made to the accompanying drawings, in which.

DETAILED DESCRIPTION OF THE INVENTION

Figure 1:
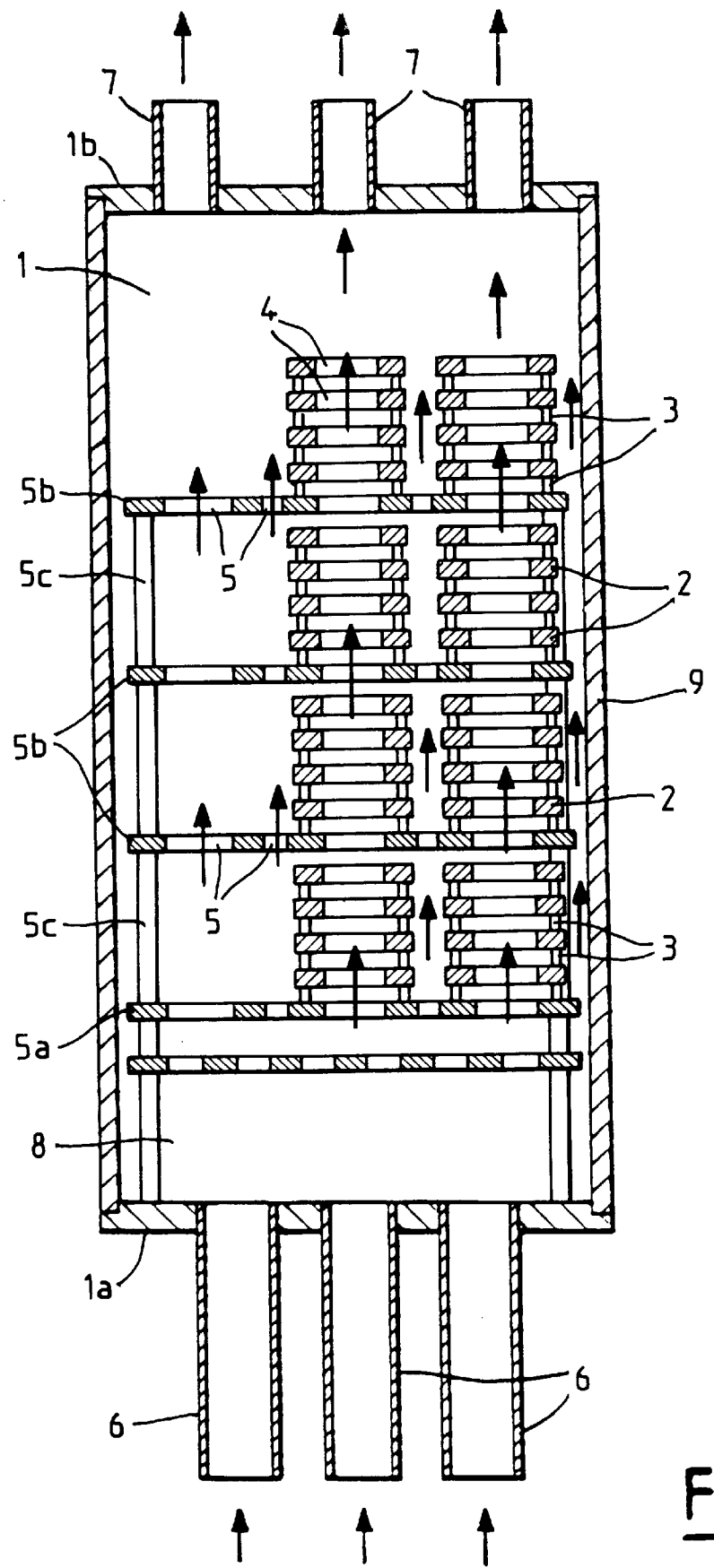
FIG. 1 is a diagram showing how a reaction chamber of a chemical vapor infiltration installation is filled in a known method.

FIG. 1 is a diagram of a reaction chamber 1 of a chemical vapor infiltration installation. The chamber 1 is generally cylindrical in shape about a vertical axis. Annular fiber preforms 2, e.g. for manufacturing airplane brake disks made of carbon-carbon composite, are loaded into the chamber 1 in a configuration that is conventional in the state of the art.

The preforms are disposed in a plurality of stacks extending in the vertical longitudinal direction of the chamber 1 (only two stacks are shown). The stacks are supported by tooling comprising bottom and intermediate loading trays 5a and 5b having holes 5 to allow gas to pass through, together with spacers 5c between the trays. The entire assembly rests on the bottom 1a of the chamber.

In order to densify the preforms 2, a gas containing a precursor of carbon, such as propane mixed with methane or natural gas, is injected into the chamber 1. In the example shown, the gas is conveyed by a plurality of ducts 6 which open out into the bottom portion of the chamber at locations that are more or less regularly spaced apart. The residual gases are extracted from the top portion of the chamber via ducts 7.

In the bottom portion of the chamber, the gas passes through a preheating zone 8 containing perforated preheating plates, prior to reaching the bottom loading tray 5a. The preheating plates are situated in the chamber 1a and they are always close to the temperature which obtains inside the chamber, thereby enabling the gas to be preheated effectively.

The inside of the chamber is heated by a graphite susceptor 9 forming a heater core that is electro-magnetically coupled with an inductor (not shown). The susceptor 9 defines the inside volume of the vertical axis chamber whose bottom 1a has the ducts 6 passing therethrough and whose cover 1b has the ducts 7 passing therethrough. The bottom and the cover are also made of graphite as are the various plates, trays, and spacers contained inside the chamber.

In well-known manner, the fiber preforms 2 are densified by depositing pyrolytic carbon therein as produced by decomposing the precursor which is contained in the gas that diffuses inside the accessible internal pores of the preforms. In the chamber 1, between the preheating zone 8 and the outlet ducts 7, the gas flows by passing inside and outside the stacks of substrates 2. In order to allow the gas to access the faces of the preforms 2, they are held apart from one another in each of the stacks, by means of spacers 3 which leave spaces 4 between the substrates.

Figure 2:
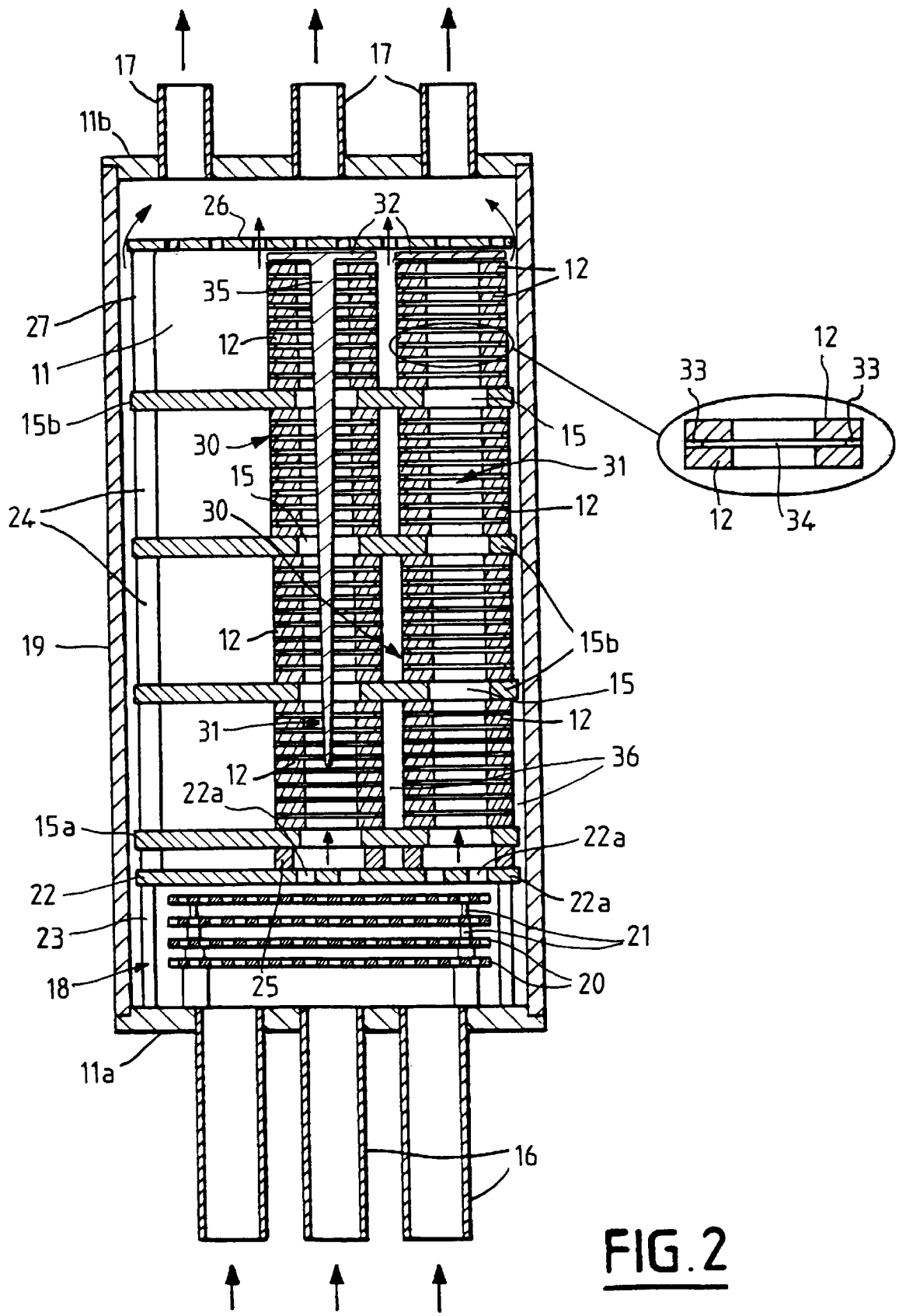
FIG. 2 is a diagram showing an implementation of the method of the invention for densifying annular preforms for brake disks.

In order to densify annular preforms using a method of the invention, the reaction chamber is loaded differently, as shown in FIG. 2.

As in the chamber shown in FIG. 1, the reaction chamber 11 is cylindrical in space about a vertical axis and is defined by a graphite susceptor 19, a bottom 11a of graphite closing the bottom portion of the chamber, and a graphite cover 11b closing the top portion of the chamber.

In conventional manner, the infiltration installation includes an inductor (not shown) surrounding the susceptor 19. The inductor is coupled to the susceptor 19 which acts as a heating core, for the purpose of heating the chamber 11. Power supply to the inductor is controlled so as to maintain the temperature that obtains inside the chamber 11, as measured by means of a sensor (not shown) at the desired value.

The preforms 12 are carbon fiber preforms for densifying by means of a pyrolytic carbon matrix, e.g. preforms for airplane brake disks. They are made up of superposed carbon fiber plies bonded together by needling. A method of making carbon fiber preforms constituted by plies that are stacked flat and then needled together is described, in particular in document FR-A-2 584 106.

The gas containing one or more precursors for carbon is injected into the chamber 11 via feed ducts 16 leading to the bottom end of the chamber through its bottom 11a. The gas giving rise to pyrolytic carbon is constituted, for example, by propane, a carbon precursor, and by natural gas. The residual gas is extracted from the top portion of the chamber by means of exhaust ducts 17 passing through the cover 11b. The exhaust ducts are connected to a pump device (not shown), enabling the desired pressure to be established inside the chamber.

The gas penetrating into the chamber 11 is preheated by passing through a plurality of perforated preheating plates 20 which are spaced part from one anther and from the bottom 11a by spacers 21. The preheating plates 20 and the spacers 21 are made of graphite. By passing through the plates 20, the gas is raised to a temperature close to that which obtains inside the chamber 11.

The preheated gas then passes through a diffusing plate 22 which rests on the bottom 11a via legs 23. The plate 22 has passages 22a at regular intervals for the purpose of distributing the gas in substantially uniform manner over the entire section of the chamber 11.

The preforms 12 are identical and they are disposed in vertical stacks 20 on circular support trays 15a and 15b. These trays have holes 15 and they are held spaced apart from one another by spacers 24. The support trays 15a and 15b and the spacers 24 are made of graphite, for example. The bottom support tray 15a stands on the diffuser plate 22 via blocks 25 which keep it spaced apart therefrom. A circular perforated top plate 26 can be placed above the load so as to make the temperature of the load uniform by screening the preforms situated in the top portion of the load against thermal radiation. The plate 26 rests on the top support tray via spacers 27. A plurality of stacks of preforms are built up and are distributed more or less regularly over the surfaces of the trays 15a and 15b (only two stacks are shown in FIG. 2). Each stack 30 comprises a plurality of preforms 12 disposed one above another along a common vertical axis and occupying the gap between two trays. The preforms stacked on the various trays 15a, 15b are vertically aligned with the holes 15, which holes have diameters that are equal to or slightly greater than the inside diameters of the preforms 12. Thus, the stacks 30 of vertically-aligned preforms define respective central passages in the form of chimneys 31 constituted by the central openings in the annular preforms 12 and the holes 15 in the trays. These passages 31 are closed at their top ends by solid screens 32.

The preheated gas coming from the diffuser plate 22 is channelled towards the volume constituted by the interior passages 31 of the stacks 30. To this end, the blocks 25 between the diffuser plate 22 and the bottom support tray 15a are constituted by rings of diameter equal to or slightly greater than the diameter of the holes 15 and they are in alignment therewith so that the gas is directed exclusively into the passages 31. The diffuser plate 22 is provided with perforations 22a solely in register with the passages 31.

Spacer elements 33 of small thickness are placed in each pile between the preforms 12, or at least between groups of stacked-together preforms. Similar spacer elements are also disposed between the support trays and the first preforms supported thereby, and also between the last preforms in the stacks 30 and the screens 32. These spacer elements 33 provide leakage passages 34 for the gas between the inside and the outside of the preforms, allowing pressure to be balanced between the passages 31 and the internal volume of the chamber 11, and enabling the gas to diffuse from the main plane faces of the preforms 12. In this way, the gas coming from the preheating zone is channeled towards the internal passages 31 of the stacks 30 and then flows from the inside towards the outside of each stack 30 into the volume 36 of the chamber outside the stacks 30, from which it is removed via the perforated plate 26 and the outlet ducts 17.

In order to compensate the headloss due to these lateral leaks which are also accompanied by the diffusion of the gas into the preforms, and for the purpose of ensuring that the flow speed of the gas is substantially constant along the passages 31, the circular flow section of the passages can be decreased progressively in the flow direction of the gas, from the bottom towards the top. This decrease in flow section can be obtained by inserting a central vertical tooling element 35 of increasing section in the gas flow direction inside each passage 31. This tooling element 35 (only one of which is shown in FIG. 2) is in the form of a "stalactite", e.g. being fixed to the underside of the screen 32 situated at the top of the passage.

Compared with a disposition of the kind shown in FIG. 1, and for a given flow rate of gas admission, a significant advantage of the method of the invention is that the retention time of the gas in the chamber 11 is reduced, and constant renewal is guaranteed of the gas in which the outside surfaces of the preforms are immersed.

The retention time in a reaction chamber of an industrial oven has been measured. For a given admission flow rate, the retention time, measured between the feed ducts 16 and the tops of the stacks of preforms was 0.4 seconds (s) using a disposition of the kind shown in FIG. 2, whereas it was 1.8 s with the disposition of FIG. 1. This reduction in retention time, due to the fact that the gas is channelled into a small volume constituted by the interior passages of the stacks, guarantees that the microstructure of the pyrocarbon deposited over the full length of the stacks of preforms remains constant.

Also, by necessarily establishing flow between the inside and the outside of each stack, continuous renewal of the gas is obtained in the spaces between the stacked preforms as provided by the spacers 34. These spaces can therefore be narrow, much less than 5 mm, e.g. having a thickness lying in the range about 0.1 mm to about 5 mm, thereby enabling the occupancy rate of the oven to be optimized. In contrast, in the disposition of FIG. 1, the gas flows preferentially in the vertical direction inside and outside the stacks of preforms. To ensure that sufficient flow exists along the spaces between the stacked preforms, it is necessary to provide spaces of relatively great width, to the detriment of the occupancy rate of the oven. If such large gaps are not provided, there is a risk of the gas stagnating in the spaces between the preforms, and consequently, there is a risk of the microstructure of the pyrocarbon deposited by diffusion of said gas becoming degraded.

Also, since the retention time can be greatly reduced for constant flow rate when using the method of the invention, it is possible at constant retention time to reduce the flow rate correspondingly. Thus, if a considerable decrease in retention time is of no advantage in ensuring that the microstructure of the deposited pyrocarbon is constant throughout the chamber, then it is possible to reduce the gas flow rate. This reduces consumption of carbon precursor, and the size of the preheating zone can also be reduced without degrading the quality of preheating, thereby increasing the working volume of the reaction chamber, and decreasing pumping requirements for maintaining the pressure inside the chamber at the desired value.

The method of the invention can be implemented using annular porous substrates other than those shown in FIG. 2, and more generally with substrates that are bodies of revolution and that include respective central axial openings or passages.

Figure 3:
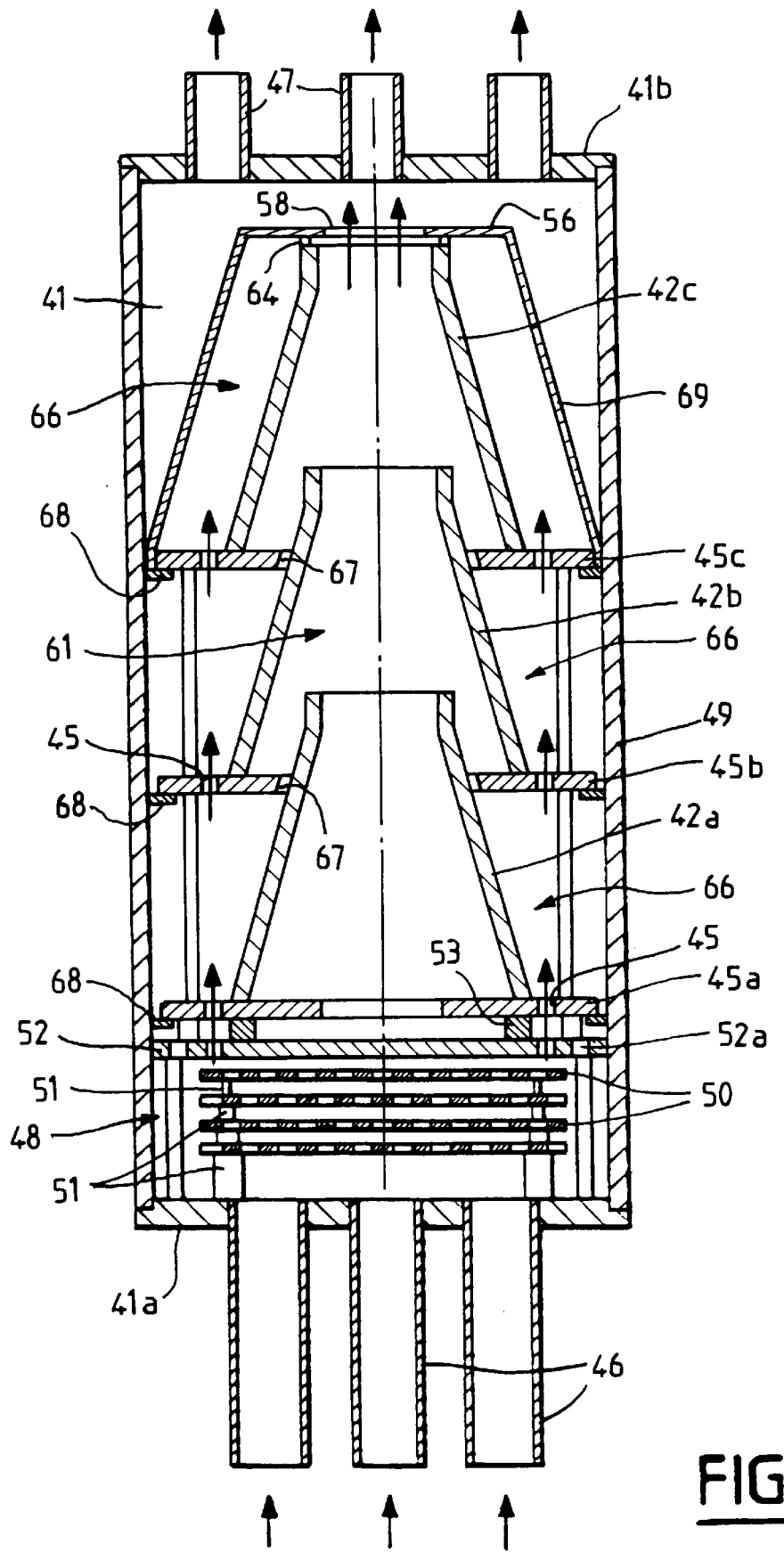
FIG. 3 is a diagram of another implementation of the method of the invention for densifying preforms for the diverging parts of thruster nozzles.

Thus, in the reaction chamber of the infiltration installation shown diagrammatically in FIG. 3, the porous substrates to be densified are the fiber preforms for the diverging parts of thruster nozzles. By way of example, the preforms may be made of carbon fibers that are to be densified by means of a matrix of pyrolytic carbon.

As shown in FIG. 2, the reaction chamber 41 is cylindrical in shape about a vertical axis and is defined by a graphite susceptor 49, a graphite bottom 41a closing the bottom of the chamber, and a graphite cover 41b closing the top of the chamber. The susceptor 49 forms a heater core that is coupled to an inductor (not shown) surrounding the chamber.

The gas containing one or more precursors for carbon is injected into the chamber 41 via feed ducts 46 leading to the bottom end of the chamber and passing through its bottom 41a. By way of example, the gas may comprise propane mixed with methane or with natural gas. The residual gas is extracted from the top portion of the chamber via exhaust ducts 47 passing through the cover 41b. The exhaust ducts are connected to a pumping device (not shown) enabling the desired pressure to be established inside the chamber.

The gas penetrating into the chamber 41 is preheated in a preheating zone 48 by passing through perforated preheating plates 50 that are spaced apart from one another and from the bottom 41 by spacers 51. The preheating plates and the spacers 51 may be made of graphite, for example. By crossing the preheating zone 48 and passing through the plates 50, the gas is brought to a temperature which is close to that which obtains inside the chamber 41. The preheated gas then passes through a diffuser plate 52 having holes 52a and standing on the bottom 41a by means of legs.

In this example, there are three preforms to be densified 42a, 42b, and 42c which are disposed so that their axes substantially coincide with the vertical axis of the chamber 41, the diverging parts flaring downwards. Their flaring or frustoconical shape makes it possible to place the preforms so that they are partially engaged one within another, forming a vertical stack, with the tops of preforms 42a and 42b being located inside preforms 42b and 42c respectively.

The preforms are supported by means of respective horizontal trays, namely a bottom tray 45a, and two annular intermediate trays 45b and 45c which are spaced apart from one another by spacers 54. A circular top plate rests on the top preform 42a. It has a central opening 58 in alignment with the vertical passage 51 formed by the central channels of the preforms being in alignment.

The preheated gas coming from the diffuser plate 52 is channeled towards a volume 66 situated inside the chamber 41 outside the preforms 42a, 42b, and 42c. To this end, the preheated gas is channelled towards calibrated holes 45 formed through a peripheral zone of the tray 45a, outside the zone on which the downstream end of the preform 42a rests, and it also passes through calibrated holes 45 formed in the peripheral zones of the trays 45b and 45c outside the zones on which the downstream ends of the preforms 42b and 42c rest. The bottom tray 45a may be annular in shape so as to lighten its weight, in which case a ring 53 is placed between the diffuser plate 52 and the bottom tray 45a so as to prevent the gas gaining access to the passage 61 on leaving the preheating zone. Under such circumstances, the diffuser plate 52 is pierced only in its peripheral zone.

The intermediate support trays 45b and 45c have respective central openings 67 with the walls thereof possibly being substantially frustoconical in shape to match the shape of the outside surfaces of the preforms they surround, and being of a size that is determined, as is the height of the spacers 54, so that the trays 45b and 45c co-operate with the outside surfaces of the preforms 42a and 42b to leave gaps of predetermined small width, e.g. one millimeter to a few tenths of a millimeter. A gap of similar width is provided by means of spacers 64 between the top of the preform 42c and the top plate 56.

Additional tooling elements may be used, such as annular gaskets 68 closing the gaps between the outside edges of the support trays 45a, 45b, and 45c, and the inside wall of the susceptor 49, and a frustoconical wall 69 which extends between the inside wall of the susceptor 49 and the top plate 56, around the outside surface of the preform 42c so as to define a small volume thereabout. The frustoconical wall 69 may be fixed beneath the top plate 56.

The supporting trays, the spacers, and other tooling elements used inside the chamber 41 may be made of graphite, for example.

With the disposition described above, the gas flows from the volume 66 outside the stack 60 towards the interior passage 61 from which it is exhausted via the ducts 47. The gaps between the preforms 42a and 42b, and the intermediate support trays 45b and 45c serve to allow pressure to be balanced between the inside and the outside of the stack 60 and also to allow gas to flow continuously through these gaps, so that the outside surfaces of the preforms 62a and 62b are immersed in a gas that is constantly renewed, all the way up to the tops thereof. The gap between the top of preform 42c and the top plate 56 also serves to balance pressure and allows the gas that reaches the top of the volume 66 to be exhausted.

In order to optimize retention time, it is preferable to channel the gas coming from the preheating zone into the volume 66 outside the preforms, rather than into the inside volume 61. Unlike the configuration of FIG. 2, the volume outside the preforms is smaller than the inside volume, and a greater reduction of retention time is obtained by directing the gas into the smaller of the two volumes. The calibrated orifices 45 provide a degree of control over the flow, and the wall 69 contributes to decreasing the volume 66 while still leaving enough space around the preform 42c.

This case thus likewise produces the above-mentioned advantages of a considerable reduction in retention time, particularly with respect to obtaining constant microstructure for the material deposited within the substrates along the entire longitudinal direction of the chamber 41, and it also offers the option of reducing the flow rate at which gas is admitted.

It will be observed that the number of preforms could be other than three, depending on the dimensions of the preforms and of the infiltration chamber, and that is not essential for them to be partially engaged one within another, it being possible to use tooling elements that can optionally be associated with the support trays to close the spaces between adjacent preforms, while leaving only gaps of small width.

The method of the invention can be implemented with substrates that are not necessarily annular. It suffices to place the substrates in such a manner as to subdivide the chamber into one or more volumes into which the gas can be admitted and one or more volumes from which the residual gas can be exhausted after passing between the substrates or after diffusing through them. The substrates can be disposed in one or more annular or hollow stacks having interior passages defined by the substrates.

Figure 4:
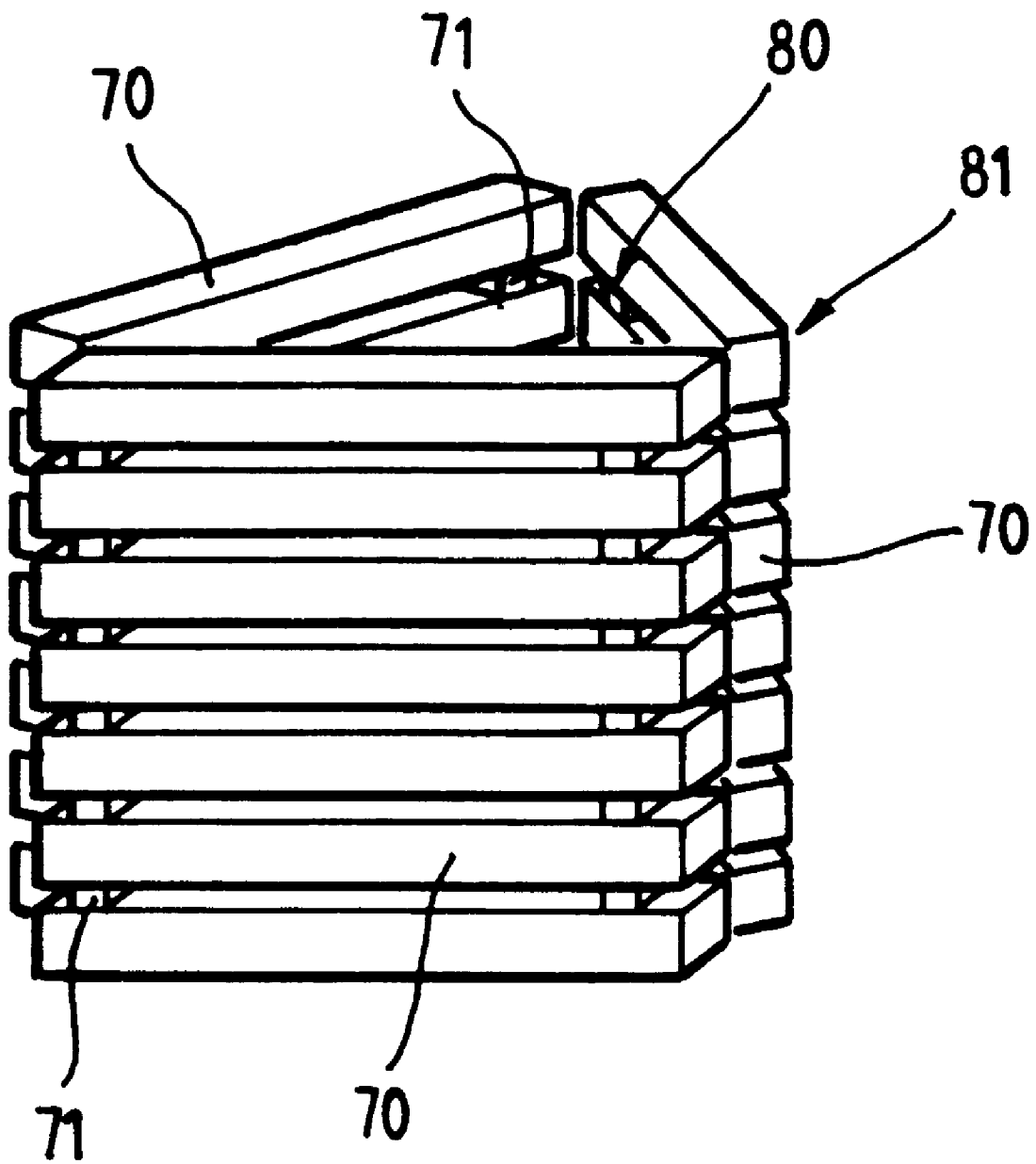
FIG. 4 is a diagram of another way of loading substrates suitable for enabling the method of the invention to be implemented.

One such disposition is shown very daigrammatically in FIG. 4. The substrates 70 are in the form of rectangular bars which are stacked in superposed layers so as to form, in each layer, a polygon that is closed or almost closed, e.g. a triangle. In a stack, the bars 70 thus define an interior volume or passage 80 and an exterior volume 81. Spacers 71 are placed between the superposed bars 70 in order to keep them slightly spaced apart from one another.

The substrates 70 are loaded into a chamber in one or more vertical stacks, e.g. in a manner similar to that shown in FIG. 2. The essential difference lies in each annular substrate being replaced by a plurality of substrates disposed so as to obtain a polygonal shape.

Where appropriate, the internal volume of the reaction chamber can be subdivided into two volumes, with the gas being admitted into one of them and being exhausted from the other one, by combining substrates and tooling elements. This may be the case, in particular, when substrates of different shapes and/or sizes are loaded simultaneously.

Although in the preceding examples it is assumed that the preforms are going to be densified with pyrolytic carbon, the invention is naturally applicable to chemical vapor infiltration using materials other than carbon, and in particular using ceramics, specifically for manufacturing parts made of ceramic matrix composite material.

In addition, the chamber can be fed with gas and residual gas can be exhausted therefrom respectively from the top portion and from the bottom portion of the reaction chamber, i.e. with the gas flowing downwards through the chamber, without that bringing into question the principles of the invention.

We claim:

1. A chemical vapor infiltration method for densifying porous substrates by depositing material within the substrates, the method comprising:

loading substrates to be densified into a reaction chamber of an infiltration oven, with the substrates being disposed in at least one annular or hollow stack which extends in a longitudinal direction of the chamber and which defines an interior passage;

admitting a gas containing at least a precursor of the material to be deposited into the reaction chamber in the vicinity of a first longitudinal end thereof;

channeling the admitted gas towards only one of the two volumes constituted by the interior passage of the at least one stack and the outside of the at least one stack, at the end of said stack closer to said first longitudinal end of the chamber, with the volume into which the gas is channeled being closed at its end farther from said first longitudinal end of the chamber; and exhausting residual gas via an outlet situated in the vicinity of a second longitudinal end of said chamber opposite from said first longitudinal end;

wherein said substrates are stacked while leaving spaces between the substrates which open into the interior passage and the outside of said at least one stack to allow pressure to be balanced therebetween, whereby said channeled gas is caused to flow from the interior passage to the outside of said at least one stack, or vice versa, with the gas passing through the spaces between the substrates and diffusing into them.

2. A method according to claim 1, in which the gas admitted into the chamber is preheated by passing through a preheating zone situated at the first end of the chamber, characterized in that the channeling of the gas towards the inside or the outside of the, or each, stack is performed at the outlet from the preheating zone.

3. A method according to claim 2, characterized in that;

the channelling of the admitted gas is performed towards the smaller of the two volumes constituted by the inside and the outside of the stack(s) of substrates; and a compensation element is disposed inside the, or each, stack, the cross-section of the compensation element increasing in the flow direction of the gas so as to compensate for lateral leaks through the substrates and between them by reducing the flow section inside the stack in such a manner as to maintain a substantially constant flow speed for the gas in the longitudinal direction inside the stack.

4. A method according to claim 1, characterized in that the channelling of the admitted gas is performed towards the smaller of the two volumes constituted by the inside and the outside of the stack(s) of substrates.

5. A method according to claim 1 characterized in that a compensation element is disposed inside the, or each, stack, the cross-section of the compensation element increasing in the flow direction of the gas so as to compensate for lateral leaks through the substrates and between them by reducing the flow section inside the stack in such a manner as to maintain a substantially constant flow speed for the gas in the longitudinal direction inside the stack.

6. A method according to claim 5, for densifying substrates that are substantially in the form of a body of revolution with a central opening and the substrates are disposed in at least one stack which defines an interior volume formed by the central openings of the substrates;

the spaces between the preforms in the, or each, stack are caused to be less than 5 mm thick;

the preforms are loaded into the chamber in a plurality of parallel stacks; and the gas admitted into the chamber is channelled towards the interior volume of the stacks of preforms.

7. A method according to claim 1, for densifying substrates that are substantially in the form of a body of revolution with a central opening, characterized in that the substrates are disposed in at least one stack which defines an interior volume formed by the central openings of the substrates.

8. A method according to claim 7, for densifying annular preforms for brake disks, characterized in that the spaces between the preforms in the, or each, stack are caused to be less than 5 mm thick.

9. A method according to claim 7, for densifying annular preforms for brake disks, characterized in that the preforms are loaded into the chamber in a plurality of parallel stacks.

10. A method according to claim 9, characterized in that the gas admitted into the chamber is channelled towards the interior volume of the stacks of preforms.

11. A method according to claim 7, for densifying preforms for the diverging parts of thruster nozzles, characterized in that the gas admitted into the chamber is channelled towards the volume situated outside the preforms.

12. A method according to claim 7, for densifying preforms for the diverging parts of thruster nozzles, characterized in that the preforms are disposed one above the other in such a manner that a preform is partially engaged inside another.

13. A method according to claim 7, for densifying preforms for the diverging parts of thruster nozzles, characterized in that the gas admitted into the chamber is channelled towards the volume situated outside the preforms; and the preforms are disposed one above the other in such a manner that a preform is partially engaged inside another.

* * * * *